United States Patent
Nishida et al.

(10) Patent No.: US 7,838,890 B2
(45) Date of Patent: Nov. 23, 2010

(54) OPTICAL DEVICE AND METHOD FOR MANUFACTURING OPTICAL DEVICE

(75) Inventors: Tetsuo Nishida, Suwa (JP); Hijime Onishi, Chino (JP)

(73) Assignee: Seiko Epson Corporation (JP)

( * ) Notice: Subject to any disclaimer, the term of this patent is extended or adjusted under 35 U.S.C. 154(b) by 777 days.

(21) Appl. No.: 11/696,219

(22) Filed: Apr. 4, 2007

(65) Prior Publication Data

US 2007/0238208 A1 Oct. 11, 2007

(30) Foreign Application Priority Data

Apr. 10, 2006 (JP) ............................. 2006-107094
Dec. 15, 2006 (JP) ............................. 2006-338600

(51) Int. Cl.
*H01L 33/00* (2010.01)

(52) U.S. Cl. ............................ 257/85; 257/84; 257/88; 257/97; 257/103; 257/E33.026; 257/E33.027; 257/E33.049

(58) Field of Classification Search .................. 257/88, 257/103, 84, 85, 97, E33.026–27, E33.049
See application file for complete search history.

(56) References Cited

U.S. PATENT DOCUMENTS

2005/0167698 A1* 8/2005 Hisaka ........................ 257/194

2006/0022207 A1* 2/2006 Nishida et al. ............... 257/88

FOREIGN PATENT DOCUMENTS

| JP | 2004-006548 | 1/2004 |
|----|-------------|--------|
| JP | 2006-066845 | 3/2006 |
| JP | 2006-066846 | 3/2006 |

* cited by examiner

*Primary Examiner*—Kiesha R Bryant
*Assistant Examiner*—Minchul Yang
(74) *Attorney, Agent, or Firm*—Harness, Dickey & Pierce, P.L.C.

(57) ABSTRACT

A method for manufacturing an optical device comprises steps of: (a) laminating a first, a second, a third, a fourth, a fifth, and a sixth semiconductor layers; (b) patterning at least the third, fourth, fifth and sixth semiconductor layers, thereby forming a light emitting device section and a rectification section; (c) forming first and second electrodes for driving the light emitting device section; and (d) connecting the fourth and sixth semiconductor sections between the first and second electrodes in parallel with the light emitting device section so as to have a rectification action in a reverse direction with respect to the light emitting device section, wherein the step (b) includes conducting etching until a portion of a top surface of the third semiconductor layer is exposed.

11 Claims, 12 Drawing Sheets

OPTICAL DEVICE AND METHOD FOR MANUFACTURING OPTICAL DEVICE

The entire disclosure of Japanese Patent Application Nos: 2006-107094, filed Apr. 10, 2006 and 2006-338600, filed Dec. 15, 2006 are expressly incorporated by reference herein.

BACKGROUND

1. Technical Field

The present invention relates to optical devices, and methods for manufacturing the same.

2. Related Art

Optical devices may sometimes be damaged by static electricity caused by machines or operators during the mounting process. In particular, a surface-emitting type semiconductor laser (hereafter referred to as a "surface-emitting laser") has a smaller device volume compared to an ordinary edge-emitting type semiconductor laser, such that the electrostatic breakdown voltage of the device itself is low. In particular, a surface-emitting laser has a certain tolerance to a forward bias voltage, but has a low tolerance to a reverse bias voltage, and the device may be destroyed when a reverse bias voltage is impressed. A variety of measures are usually implemented in the mounting process to remove static electricity, but these measures have limitations. For example, Japanese Laid-open Patent Application JP-A-2004-6548 describes an example of related art.

SUMMARY

In accordance with an advantage of some aspects of the invention, there are provided an optical device and its manufacturing method in which electrostatic breakdown of the device can be prevented and reliability of the device can be improved.

A method for manufacturing an optical device in accordance with an embodiment of the invention includes the steps of:

(a) laminating, above a substrate, a first semiconductor layer of a first conductivity type, a second semiconductor layer that functions as an active layer, a third semiconductor layer of a second conductivity type, a fourth semiconductor layer composed of a material having a greater etching rate than the third semiconductor layer, a fifth semiconductor layer that functions as a capacitance reducing section, and a sixth semiconductor layer of the first conductivity type;

(b) patterning at least the third, fourth, fifth and sixth semiconductor layers, thereby forming a light emitting device section including a first semiconductor section of the first conductivity type, a second semiconductor section that functions as an active layer and a third semiconductor section of the second conductivity type which are disposed over the substrate in this order from the side of the substrate, and a rectification device section including a fourth semiconductor section of the second conductivity type, a fifth semiconductor section composed of a material having a greater etching rate than the fourth semiconductor section, a capacitance reducing section and a sixth semiconductor section of the first conductivity type;

(c) forming first and second electrodes for driving the light emitting device section; and (d) connecting the fourth and sixth semiconductor sections between the first and second electrodes in parallel with the light emitting device section so as to have a rectification action in a reverse direction with respect to the light emitting device section, wherein the step (b) includes conducting etching until a portion of a top surface of the third semiconductor layer is exposed.

According to the embodiment of the invention described above, when a reverse bias voltage is impressed to the light emitting device section, a current flows to the semiconductor section of the rectification device section connected in parallel with the light emitting device section. As a result, the electrostatic breakdown voltage to a reverse bias voltage can be considerably improved. Accordingly, electrostatic destruction of the device can be prevented and the reliability of the device can be improved in the mounting process and the like.

Also, in the method for manufacturing an optical device in accordance with the embodiment, the fourth semiconductor layer composed of a material having a greater etching rate than the third semiconductor layer is used, which makes it easier to etch the semiconductor layers until a portion of the top surface of the third semiconductor layer is exposed, in other words, this makes it easier to stop etching at an interface between the fourth semiconductor layer and the third semiconductor layer. By this, the top surface of the third semiconductor section and the fourth semiconductor section can be planarized. Accordingly, the top surface of the third semiconductor section and the fourth semiconductor section can have good contact with the electrodes. Also, the film thickness of the third semiconductor section can be made uniform with excellent reproducibility, such that, for example, when the third semiconductor section functions as a mirror, controllability of the reflectivity of the mirror can be improved. As a result, in manufacturing optical devices, uniformity and reproducibility of the device characteristics can be improved, and the manufacturing yield can consequentially be improved.

It is noted that, in the invention, the case where a layer B is provided above a specific layer A may include a case where the layer B is provided directly on the layer A, and a case where the layer B is provided above the layer A through another layer on the layer A. This similarly applies to embodiments to be described below.

In the method for manufacturing an optical device in accordance with the embodiment, the capacitance reducing section may be composed of intrinsic semiconductor.

In the method for manufacturing an optical device in accordance with the embodiment, the capacitance reducing section may be composed of semiconductor including an impurity with a lower concentration than that of the fourth or sixth semiconductor section.

In the method for manufacturing an optical device in accordance with the embodiment, the fifth semiconductor section may be formed to have the second conductivity type.

In the method for manufacturing an optical device in accordance with the embodiment, in the step (b), the fourth semiconductor layer may be etched by wet etching, to expose a portion of the top surface of the fourth semiconductor section.

In the method for manufacturing an optical device in accordance with the embodiment, the fourth semiconductor section may be formed to include a GaAs layer at its topmost surface, and the fifth semiconductor section may be formed from an InGaP layer.

In the method for manufacturing an optical device in accordance with the embodiment, the fourth semiconductor section may be formed to include a GaAs layer at its topmost surface, and the fifth semiconductor section may be formed from a AlGaAs layer.

An optical device in accordance with an embodiment of the invention includes:

a light emitting device section including, above a substrate, a first semiconductor section of a first conductivity type that functions as a first mirror, a second semiconductor section that functions as an active layer, and a third semiconductor section of a second conductivity type that functions as a second mirror, arranged in this order from the side of the substrate;

a rectification device section including, above the substrate, a first support section composed of the same composition as that of the first semiconductor section, a second support section composed of the same composition as that of the second semiconductor section, a fourth semiconductor section of the second conductivity type, a fifth semiconductor section composed of a material having a greater etching rate than the fourth semiconductor section, a capacitance reducing section, and a sixth semiconductor section of the first conductivity type, which are arranged in this order from the side of the substrate; and first and second electrodes for driving the light emitting device section, wherein the fourth and sixth semiconductor sections are connected between the first and second electrodes in parallel with the light emitting device section to have a rectification action in a reverse direction with respect to the light emitting device section.

In the optical device in accordance with the present embodiment, the fourth semiconductor section may be composed of the same composition as that of the third semiconductor section.

In the optical device in accordance with the present embodiment, the capacitance reducing section may be composed of intrinsic semiconductor.

In the optical device in accordance with the present embodiment, the capacitance reducing section may be composed of semiconductor including an impurity with a lower concentration than that of the fourth or sixth semiconductor section.

In the optical device in accordance with the present embodiment, the fifth semiconductor section may have the second conductivity type.

In the optical device in accordance with the present embodiment, the fourth semiconductor section may be formed to include a GaAs layer at its topmost surface, and the fifth semiconductor section may be formed from an InGaP layer.

In the optical device in accordance with the present embodiment, the fourth semiconductor section may be formed to include a GaAs layer at its topmost surface, and the fifth semiconductor section may be formed from a AlGaAs layer.

In the optical device in accordance with the present embodiment, the light emitting device section may function as a surface-emitting type semiconductor laser, the first semiconductor section may function as a first mirror, the third semiconductor section may function as a second mirror, the topmost surface of the third semiconductor section and the fourth semiconductor section may be formed from GaAs layers, the fifth semiconductor section may be formed from a InGaP layer, the capacitance reducing section and the sixth semiconductor section may be formed from GaAs layers, and the first electrode may be formed on the top surface of the third semiconductor section, and the optical device may further include a third electrode that is electrically connected to the first electrode and formed on the top surface of the sixth semiconductor section, and a fourth electrode that is electrically connected to the second electrode and formed on the top surface of the fourth semiconductor section.

DESCRIPTION OF EXEMPLARY EMBODIMENTS

A preferred embodiment of the invention is described below with reference to the accompanying drawings.

1. Structure of Optical Device

Figure 1:
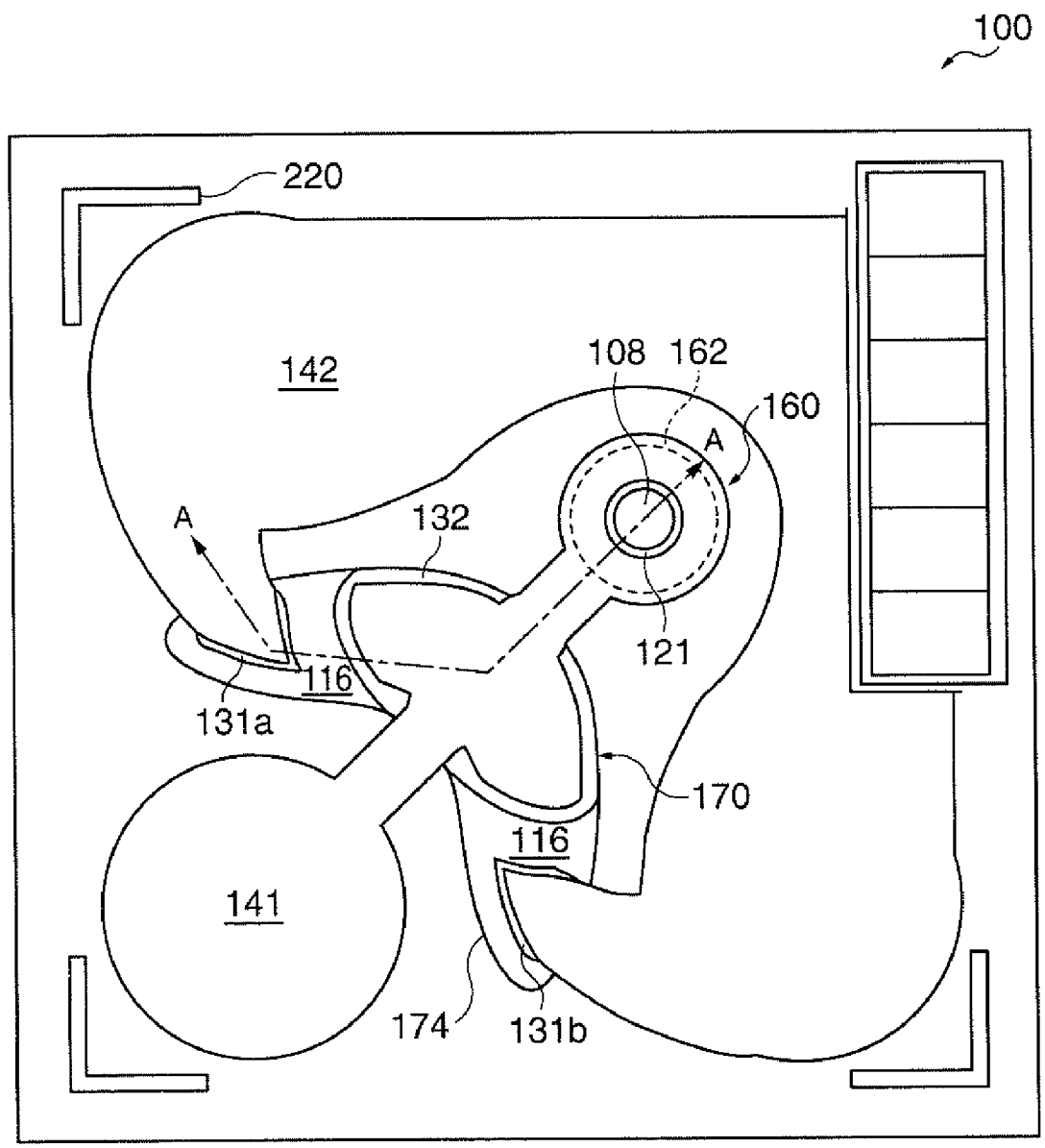
FIG. 1 is a plan view schematically showing an optical device in accordance with an embodiment of the invention.
Figure 2:
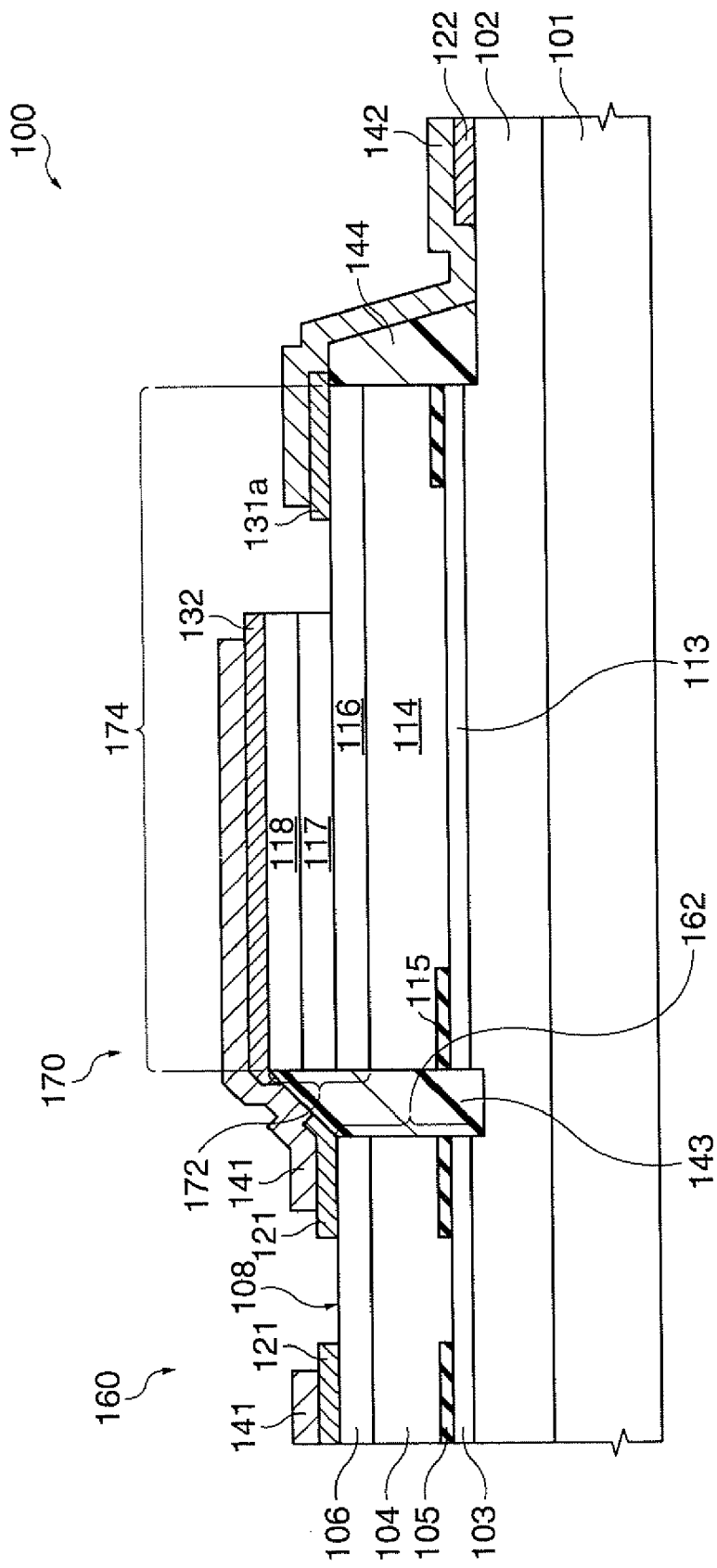
FIG. 2 is a cross-sectional view schematically showing the optical device in accordance with the embodiment.
Figure 3:
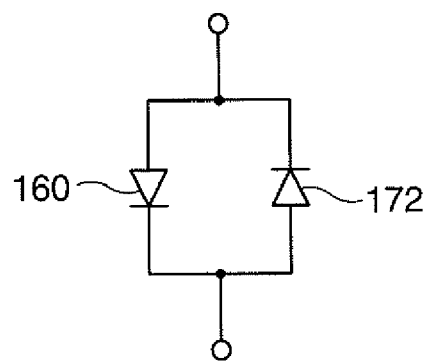
FIG. 3 is a schematic diagram showing an optical device circuit structure in accordance with the present embodiment.

FIG. 1 is a plan view schematically showing an optical device 100 in accordance with an embodiment of the invention. FIG. 2 is a cross-sectional view schematically showing the optical device 100 in accordance with the embodiment of the invention. FIG. 2 is a view showing a cross section taken along a line A-A in FIG. 1. FIG. 3 is a circuit diagram of the optical device 100 in accordance with an embodiment of the invention.

The optical device 100 in accordance with the present embodiment includes, as shown in FIG. 1 and FIG. 2, a rectification device section 170, a surface-emitting type semiconductor laser 160 that is an example of a light emitting device section, a first connection electrode 141 and a second connection electrode 142 for connecting the surface-emitting type semiconductor laser 160 and the rectification device section 170 in parallel with each other. The surface-emitting type semiconductor laser 160 and the rectification device section 170 are formed over a common substrate (a semiconductor substrate 101), and have a monolithic structure. Also, the surface-emitting type semiconductor laser 160 and the rectification device section 170 may be formed in plurality on a common substrate, respectively.

The surface-emitting type semiconductor laser 160, the rectification device section 170, and the overall structure of the device are described below. It is noted that the present embodiment is described as the first conductivity type being n-type and the second conductivity type being p-type. However, without being limited to the above, the first conductivity type may be p-type and the second conductivity type may be n-type.

1.1. Surface-Emitting Type Semiconductor Laser

The surface-emitting type semiconductor laser 160 has a vertical resonator. Also, the surface-emitting type semiconductor laser 160 may include a columnar semiconductor laminate (hereafter referred to as a "columnar section") 162. The plane configuration of the columnar section 162 may be circular, as shown in FIG. 1, without any particular limitation to this configuration.

The surface-emitting type semiconductor laser 160 has a first mirror 102 as a first semiconductor section, an active layer 103 as a second semiconductor section, a second mirror 104 as a third semiconductor section, and a contact layer 106. As the first mirror, for example, a distributed Bragg reflection type mirror (DBR) of 40 pairs of alternately laminated n-type $Al_{09}Ga_{0.1}As$ layers and n-type $Al_{0.15}Ga_{0.85}As$ layers may be used. As the active layer 103, a layer composed of GaAs well layers and $Al_{0.3}Ga_{0.7}As$ barrier layers in which the well layers include a quantum well structure composed of three layers can be used. As the second mirror 104, a distributed reflection type multilayer mirror of 25 pairs of alternately laminated p-type $Al_{0.9}Ga_{0.1}As$ layers and p-type $Al_{0.15}Ga_{0.85}As$ layers can be used. As the contact layer 106, for example, a p-type GaAs layer can be used. It is noted that the composition of each of the layers and the number of the layers described above are not limited to the above.

The second mirror 104 is made to be p-type, for example, by doping carbon (C), and the first mirror 102 is made to be n-type, for example, by doping silicon (Si). Accordingly, the p-type second mirror 104, the active layer 103 in which no impurity is doped, and the n-type first mirror 102 form a pin diode.

A current constricting layer 105, which may be obtained by oxidizing an AlGaAs layer from its side surface, is formed in a region among the layers composing the second mirror 104 near the active layer 103. The current constricting layer 105 can have a ring shape along the circumference of the columnar section 162.

Also, the surface-emitting type semiconductor laser 160 further includes a p-type first electrode 121 and an n-type second electrode 122. The first electrode 121 is provided on the second mirror 104. The first electrode 121 may be formed, for example, in a ring shape, and its opening section functions as an emission surface 108 for emitting a laser beam. The second electrode 122 is provided on the first mirror 102, and in a manner to surround the columnar section 162 below the second connection electrode 142. The first electrode 121 and the second electrode 122 are used for driving the surface-emitting type semiconductor laser 160.

1.2. Rectification Device Section

The rectification device section 170 may have a junction diode 172, such as a pn junction diode, a Schottky barrier diode or the like, having a rectification action, and is formed in a region different from the surface-emitting type semiconductor laser 160 described above.

The rectification device section 170 includes a first support section 112 composed of the same composition as that of the first mirror 102, a second support section 113 composed of the same composition as that of the active layer 103, fourth semiconductor sections 114 and 116 composed of the same compositions as those of the second mirror 104 and the contact layer 106, respectively, a fifth semiconductor section 117, a capacitance reducing section 118, a sixth semiconductor section 119, a third electrode 132, and fourth electrodes 131a and 131b, which are arranged in this order from the side of the semiconductor substrate 101.

The first support section 112 is formed on the semiconductor substrate 101. The first support section 112 may be formed continuously with the first mirror 102. In other words, the first support section 112 and the first mirror 102 may be formed from a common semiconductor layer. The second support section 113 is formed on the first support section 112. The second support section 113 may be formed separated from the active layer 103 as shown in FIG. 2, or continuously with the active layer 103. In other words, the second support section 113 and the active layer 103 may be formed from a common semiconductor layer.

The fourth semiconductor sections 114 and 116 are formed on the second support section 113. In the present embodiment, the fourth semiconductor section 114 is composed of the same composition as that of the second mirror 104, and the fourth semiconductor section 116 is composed of the same composition as that of the contact layer 106. It is noted that the dielectric layer 115 may be formed in a region close to the second support section 113, among the layers composing the fourth semiconductor section 114. Such a dielectric layer 115 can be formed in the same manufacturing process applied to the current constricting layer 105 described above. The second support section 113 and the fourth semiconductor sections 114 and 116 may have a bent shape (a generally L-letter shape) as viewed in a plan view, for example, as shown in FIG. 1.

It is noted that, in the present embodiment, the junction diode 172 is composed of the fourth semiconductor section 116, the fifth semiconductor section 117, the capacitance reducing section 118 and the sixth semiconductor section 119, and the fourth semiconductor section 114 may also contribute to the operation of the junction diode 172.

The fifth semiconductor section 117 is formed in a partial area of the top surface of the fourth semiconductor section 116. The first semiconductor section 117 is composed of a material having a greater etching rate than that of the fourth semiconductor section 116. For example, when the fourth semiconductor section 116 is formed from a GaAs layer, the fifth semiconductor section 117 may be formed from a InGaP layer By using such materials, the fourth semiconductor section 116 can function as an etching stopper layer.

The fifth semiconductor section 117 may have the same conductivity type (for example, p-type) as that of the fourth semiconductor section 116. The fifth semiconductor section 117 may be composed of a material that can reduce the capacitance of the junction diode 172, like the capacitance reducing section 118 to be described below. In other words, the fifth semiconductor section 117 may preferably have a doped impurity concentration lower than that of the fourth semiconductor section 116. Alternatively, the fifth semiconductor section 117 may be composed of intrinsic semiconductor.

The capacitance reducing section 118 is formed on the fifth semiconductor section 117. The capacitance reducing section 118 can reduce the capacitance of the junction diode 172. By this, the junction diode 172 is prevented from disturbing the high speed operation of the surface-emitting type semiconductor laser 160. In particular, in accordance with the present embodiment, because the rectification device section 170 is connected in parallel with the surface-emitting type semiconductor laser 160, the capacitances of the light emitting device section 160 and the rectification device section 170 influence as an added value with respect to each other. Therefore, the reduction of the capacitance of the junction diode 172 is very effective in driving the optical device at higher speeds.

The capacitance reducing section 118 may be provided on a region of a portion of the fifth semiconductor section 117 in order to secure an electrical connection region. The material, thickness and area of the capacitance reducing section 118 can be decided based on the capacitance value of the junction diode 172. To reduce the capacitance of the junction diode 172, a material having a low relative dielectric constant may preferably be used for the capacitance reducing section 118.

The capacitance reducing section 118 may be composed of semiconductor. When the capacitance reducing section 118 is composed of intrinsic semiconductor, the junction diode 172 can be called a pin diode. It is noted that the intrinsic semiconductor is a semiconductor in which most of the carriers that contribute to electrical conduction are mostly free electrons thermally excited in a conductor from the valence band, or holes in the same number generated in the valence band, and changes in the carrier density due to the presence of impurities and/or lattice defects can be ignored.

Alternatively, when the fifth semiconductor section 117 has the same conductivity type as that of the fourth semiconductor section 116, the capacitance reducing section 118 may be composed of semiconductor having the same conductivity type (for example, p-type) as that of the fourth semiconductor section 116, and has an impurity concentration to be doped lower (for example, an impurity concentration lower by one digit or more) than that of the fourth semiconductor section 116. Alternatively, the capacitance reducing section 118 may be a semiconductor section of the same conductivity type as that of the sixth semiconductor section 119 (for example, n-type), and has an impurity concentration to be doped lower (for example, an impurity concentration lower by one digit or more) than that of the sixth semiconductor section 119.

It is noted that, to reduce the capacitance of the junction diode 172, the thickness of the capacitance reducing section 118 may preferably be made greater, and the area thereof may preferably be made smaller. The film thickness of the capacitance reducing section 118 is described below in detail The capacitance reducing section 118 may be formed from, for example, an AlGaAs layer, a GaAs layer or the like. When the capacitance reducing section 118 is formed from an AlGaAs layer, the ratio of each composition is not particularly limited, but a higher Al composition ratio may be preferred because the relative dielectric constant of the capacitance reducing section 118 can be lowered. The ratio of each composition of an AlGaAs layer of the capacitance reducing section 118 may be defined by, for example, $Al_xGa_{1-x}As$ ($x \geq 0.5$). By this, because the Al composition ratio is high, the capacitance of the junction diode 172 can be further reduced.

The film thickness of the capacitance reducing section 118 is described here. The film thickness of the capacitance reducing section 118 may preferably be at least 50 nm or greater because of the following reason. If the junction diode 172 were formed with a pn junction without the capacitance reducing section 118, the thickness of the depletion layer itself is about 50 nm. In contrast, in accordance with the present embodiment, the capacitance reducing section 118 is provided between the pn junction, and the capacitance reducing section 118 has a film thickness greater than the thickness of the depletion layer described above, and therefore can exhibit its function.

For the capacitance reducing section 118 to reduce the capacitance of the junction diode 172 to the maximum, its film thickness may preferably be made as thin as possible. However, when the film thickness reaches a certain value, the capacitance reducing effect would become saturated. Therefore, the film thickness at which a change rate in capacitance reaches a predetermined value or less may preferably be set as an upper limit value. This can be more concretely described with FIG. 4 and Formula (1). The relation between the capacitance value C and the film thickness d is indicated in Formula (1) below. In Formula (1), $\varepsilon_0$ is a dielectric constant in vacuum, $\varepsilon_r$ is a relative dielectric constant of the capacitance reducing section, S is an area of the top surface of the third electrode 132 (see FIG. 1).

[Formula 1]

$$C = \varepsilon_0 \varepsilon_r \frac{S}{d} \quad (1)$$

Figure 4:
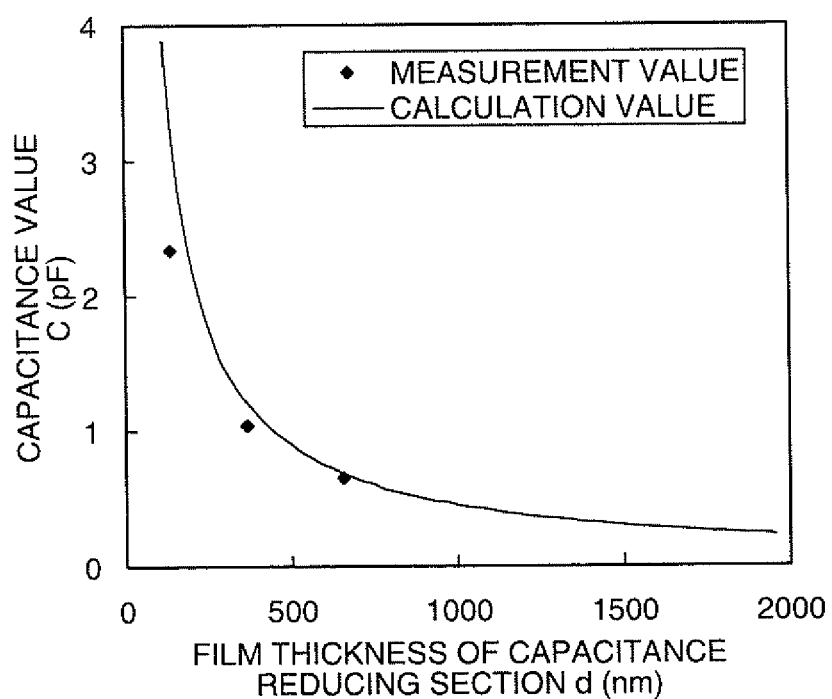
FIG. 4 is a graph showing the relation between the capacitance value C and the film thickness d in the capacitance reduction section.

FIG. 4 is a graph indicating the relation between the capacitance value C and the thickness d of the capacitance reducing section, and was created by calculation based on Formula (1) and actual measurement. In FIG. 4, the film thickness d is plotted along an axis of abscissas, and the capacitance value C is plotted along an axis of ordinates. According to FIG. 4, it is observed that, the greater the film thickness of the capacitance reducing section, the greater the capacitance is reduced. However, when the film thickness is 2 μm or greater, the capacitance value almost does not change. Accordingly, the film thickness of the capacitance reducing section 118 may preferably be set at 2 μm or smaller. By this, the capacitance reduction function is sufficiently achieved, and a reduction in size of the device can be realized. Also, in FIG. 4, the calculation and measurement were conducted, using the relative dielectric constant of GaAs as $\varepsilon_r$. It is noted that, when AlGaAs is used as the material of the capacitance reducing section, changes in the capacitance value would disappear at a smaller film thickness than that shown in FIG. 4, because the relative dielectric constant of AlGaAs is lower than the relative dielectric constant of GaAs. Accordingly, when AlGaAs is used, the film thickness of the capacitance reducing section 118 may also be set to 2 μm or less, and effects similar to the effects obtained with GaAs can be obtained.

When the fifth semiconductor section 117 is composed of a material that can reduce the capacitance of the junction diode 172, the film thickness d may be calculated as a film thickness that equals to the sum of the thickness of the capacitance reducing section 118 and the film thickness of the fifth semiconductor section 117. In this case, the film thicknesses of the capacitance reducing section 118 and the fifth semiconductor section 117 may preferably satisfy a relation of "(the film thickness of the capacitance reducing section 118)>(the film thickness of the fifth semiconductor section 117)." In other words, the fifth semiconductor section 117 may preferably be composed of a material having an etching rate different from that of the fourth semiconductor section 116, as described above, and may preferably be formed from, for example, a InGaP layer. In this case, the fifth semiconductor section 117 has a greater difference in lattice constant with respect to the fourth semiconductor section 116 than that of the capacitance reducing section 118. Therefore, by reducing the film thickness of the fifth semiconductor section 117 to a smaller value, the crystallinity of the fifth semiconductor section 117 as well as the capacitance reducing section 118 can be made better. In particular, the film thickness of the fifth semiconductor section 117 may preferably be made as small as possible. The fifth semiconductor section 117 may be formed with at least a single atom layer, and more concretely, its film thickness may be about 2-3 nm.

The sixth semiconductor section 119 is formed on the top surface of the capacitance reducing section 118. The sixth semiconductor section 119 may be formed from, for example, a p-type GaAs layer.

The fourth electrode 131a and the fourth electrode 131b are formed in a region on the fourth semiconductor section 116 where the fifth semiconductor section 117 is not formed. The fourth electrode 131a and the fourth electrode 131b are electrodes having the same function, and formed at positions separated from each other. The fourth electrode 131a is formed on one end section of the fourth semiconductor section 116, and the fourth electrode 131b is formed on the other end section. The third electrode 132 is formed on the sixth semiconductor section 119.

It is noted that the fourth semiconductor section 116 is formed, as shown in FIG. 1, in a region that does not include at least a part of a region over a virtual line connecting the fourth electrode 131a and the fourth electrode 131b, as viewed in a plan view. In other words, the fourth semiconductor section 116 is bent, and the fourth electrode 131a and the fourth electrode 131b are formed at opposite end sections of the fourth semiconductor section 116. The bent direction is the same as the bent direction of the second connection electrode 142, whereby the device area can be made smaller.

Moreover, because the fourth electrode 131a and the fourth electrode 131b are not provided on a linear fourth semiconductor section 116, the stress caused by contraction of the fourth semiconductor section 116 during the manufacturing step can be dispersed, whereby disconnection of the second connection electrode 142 can be prevented.

1.3. Overall Structure

As described above, the surface-emitting type semiconductor laser 160 and the rectification device section 170 are connected in parallel with each other. In other words, the first electrode 121 of the surface-emitting type semiconductor laser 160 and the third electrode 132 of the rectification device section 170 are electrically connected with each other by the first connection electrode 141, and the second electrode 122 of the surface-emitting type semiconductor laser 160 and the fourth electrode 131a and the fourth electrode 131b of the rectification device section 170 are electrically connected with each other by the second connection electrode 142.

The first connection electrode 141 is formed continuously from the upper surface of the first electrode 121 to the upper surface of the third electrode 132. The first electrode 121 and the third electrode 132 are formed at mutually different heights. Moreover, because the surface-emitting type semiconductor laser 160 has the columnar section 162, and the rectification device section 170 has a columnar section 174, a groove may be formed between the columnar section 162 and the columnar section 174. Accordingly, plural step differences are formed between the first electrode 121 and the third electrode 132, such that the first connection electrode 141 would likely be disconnected above the step differences.

Therefore, in the optical device 100 in accordance with the present embodiment, a resin layer 143 that is an example of an insulation layer is formed between the columnar section 162 of the surface-emitting type semiconductor laser 160 and the columnar section 174 of the rectification device section 170. The resin layer 143 has a downwardly sloped surface extending from the side of the third electrode 132 to the side of the first electrode 121, as shown in FIG. 2.

By this, the resin layer 143 covers the step differences formed along the first connection electrode 141 between the first electrode 121 and the third electrode 132, such that disconnection of the first connection electrode 141 can be prevented, which might occur if it passed directly over the plural step differences.

The second connection electrode 142 is formed continuously from the upper surface of the fourth electrode 131a and the fourth electrode 131b to the upper surface of the second electrode 122. The second connection electrode 142, and the fourth electrode 131a and the fourth electrode 131b are formed at mutually different heights. Further, because the rectification device section 170 has the columnar section 174, step differences are formed between the columnar section 174 and the second electrode 122. For this reason, the second connection electrode 142 would likely be disconnected above the step differences.

Therefore, in the optical device 100 in accordance with the present embodiment, a resin layer 144 that is an example of an insulation layer is formed between the fourth electrode 131a and the fourth electrode 131b, and the second electrode 122. The resin layer 144 has a downwardly sloped surface extending from the side of the fourth electrode 131a and the fourth electrode 131b to the side of the second electrode 122, as shown in FIG. 2.

By this, the resin layer 144 covers the step differences formed along the second connection electrode 142 between the second electrode 122 and the fourth electrode 131a and the fourth electrode 131b, such that disconnection of the second connection electrode 142 can be prevented, which might occur if it passed directly on the plural step differences.

Also, the second connection electrode 142 connects to the second electrode 122 at two places. In other words, the second connection electrode 142 connects the fourth electrode 131a and the second electrode 122, and connects the fourth electrode 131b and the second electrode 122. By this, even when one of the connections is disconnected, the other maintains the electrical connection, such that the reliability of the optical device 100 can be improved.

According to the optical device 100 of the present embodiment, even when a reverse bias voltage is impressed to the surface-emitting type semiconductor laser 160, a current flows to the junction diode 172 of rectification device section 170 that is connected in parallel with the surface-emitting type semiconductor laser 160. Accordingly, the electrostatic breakdown voltage against reverse bias voltages impressed to the surface-emitting type semiconductor laser 160 can be considerably improved. Therefore, because electrostatic breakdown can be effectively prevented in the mounting process or the like, the devices can be handled excellently, and their reliability can be improved.

On the other hand, when the surface-emitting type semiconductor laser 160 is driven, a forward bias voltage is impressed to the surface-emitting type semiconductor laser 160. In this instance, because an electric current is circulated only in the surface-emitting type semiconductor laser 160, the breakdown voltage of the junction diode 172 may preferably be greater than the drive voltage of the surface-emitting type semiconductor laser 160. By so doing, even when a forward bias voltage is impressed at the time of driving the surface-emitting type semiconductor laser 160, no (or almost no) reverse current flows in the junction diode 172, such that a normal light emission action is performed by the surface-emitting type semiconductor laser 160.

It is noted that the breakdown voltage value of the junction diode 172 can be appropriately controlled by adjusting the composition and/or impurity concentration of the fourth semiconductor section 116, the fifth semiconductor section 117, the capacitance reducing section 118 and the sixth semiconductor section 119. For example, by lowering the impurity concentration of the fourth semiconductor section 116 and the sixth semiconductor section 119, the breakdown voltage of the junction diode 172 can be made greater. In the case of the present embodiment, the sixth semiconductor section 119 can be formed without relaying on the structure of the surface-emitting type semiconductor laser 160, such that its composition and impurity concentration can be freely adjusted. Therefore the junction diode 172 with more ideal characteristics can be readily formed, and effective prevention of electrostatic destruction and more stable emission action can be realized.

In the optical device 100 of the present embodiment described above, a voltage is impressed through the first connection electrode 141 and the second connection electrode 142. In the surface-emitting type semiconductor laser 160, when a forward bias voltage is applied to the pin diode, recombinations of electrons and holes occur, thereby causing emission of light due to the recombinations. Stimulated emission occurs when the generated light reciprocates between the first mirror 102 and the second mirror 104, whereby the light intensity is amplified. When the optical gain exceeds the optical loss, laser oscillation occurs, and a laser beam is emitted from the emission surface 108 in a direction orthogonal to the semiconductor substrate 101.

It is noted that the optical device in accordance with the embodiment of the invention is applicable to other types of light emitting devices (such as, for example, a semiconductor light emitting diode, an organic LED and the like), without being limited to a surface-emitting type semiconductor laser. Also, the p-type and n-type characteristics of each of the semiconductor layers in the above described embodiment can be interchanged. The above example is described as using AlGaAs type material, but other materials, such as, for example, GaInP type, ZnSSe type, InGaN type, AlGaN type, InGaAs type, GaInNAs type, and GaAsSb type semiconductor materials can also be used depending on the oscillation wavelength to be generated.

2. Method for Manufacturing Optical Device

Next, a method for manufacturing the optical device 100 in accordance with an embodiment of the invention is described with reference to FIGS. 5 through 12. FIGS. 5-12 are views showing the steps of a method for manufacturing the optical device 100, and correspond to FIG. 2.

Figure 5:
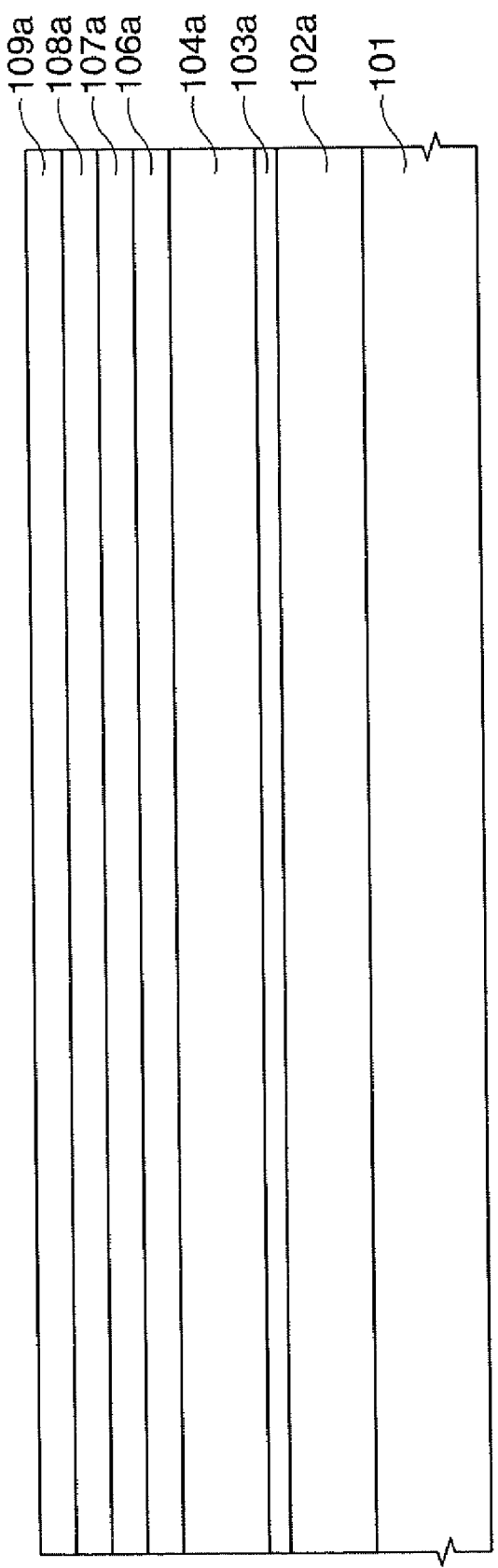
FIG. 5 is a view showing a step of a method for manufacturing an optical device in accordance with an embodiment of the invention.

(1) First, on the surface of a semiconductor substrate 101 composed of n-type GaAs, a semiconductor multilayer film is formed by epitaxial growth while modifying its composition, as shown in FIG. 5. It is noted here that the semiconductor multilayer film is formed from, for example, a first semiconductor layer 102a of 40 pairs of alternately laminated n-type $Al_{0.9}Ga_{0.1}As$ layers and n-type $Al_{0.15}Ga_{0.85}As$ layers, a second semiconductor layer 103a composed of GaAs well layers and $Al_{0.3}Ga_{0.7}As$ barrier layers in which the well layers include a quantum well structure composed of three layers, a third semiconductor layer 104a of 25 pairs of alternately laminated p-type $Al_{0.9}Ga_{0.1}As$ layers and p-type $Al_{0.15}Ga_{0.85}As$ layers, a third semiconductor layer 106a composed of a p-type GaAs layer, a fourth semiconductor layer 107a having a greater etching rate than that of the third semiconductor layer 106a, a fifth semiconductor layer 108a that functions as a capacitance reducing section, and a sixth semiconductor layer 109a composed of a n-type GaAs layer.

It is noted that the third semiconductor layer 106a is formed from a p-type GaAs layer, such that the fourth semiconductor layer 107a can be formed from, for example, a p-type $In_xGa_{1-x}P$ layer. In the $In_xGa_{1-x}P$ layer, x may preferably be 0.5 or smaller. By this, the lattice matching efficiency between the fourth semiconductor layer 107a and its lower layer, the p-type GaAs layer (the third semiconductor layer 106a), can be increased.

Also, the fifth semiconductor layer 108a may be formed from a GaAs layer in which no impurity is doped. These layers are successively laminated on the semiconductor substrate 101 to thereby form the semiconductor multilayer film, as shown in FIG. 5.

The temperature at which the epitaxial growth is conducted is appropriately decided depending on the growth method, the kind of raw material, the type of the semiconductor substrate 101, and the kind, thickness and carrier density of the semiconductor multilayer film to be formed, and in general may preferably be 450° C.-800° C. Also, the time required for conducting the epitaxial growth is appropriately decided like the temperature. Also, a metal-organic vapor phase growth (MOVPE: Metal-Organic Vapor Phase Epitaxy) method, a MBE (Molecular Beam Epitaxy) method or a LPE (Liquid Phase Epitaxy) method can be used as a method for the epitaxial growth.

Figure 10:
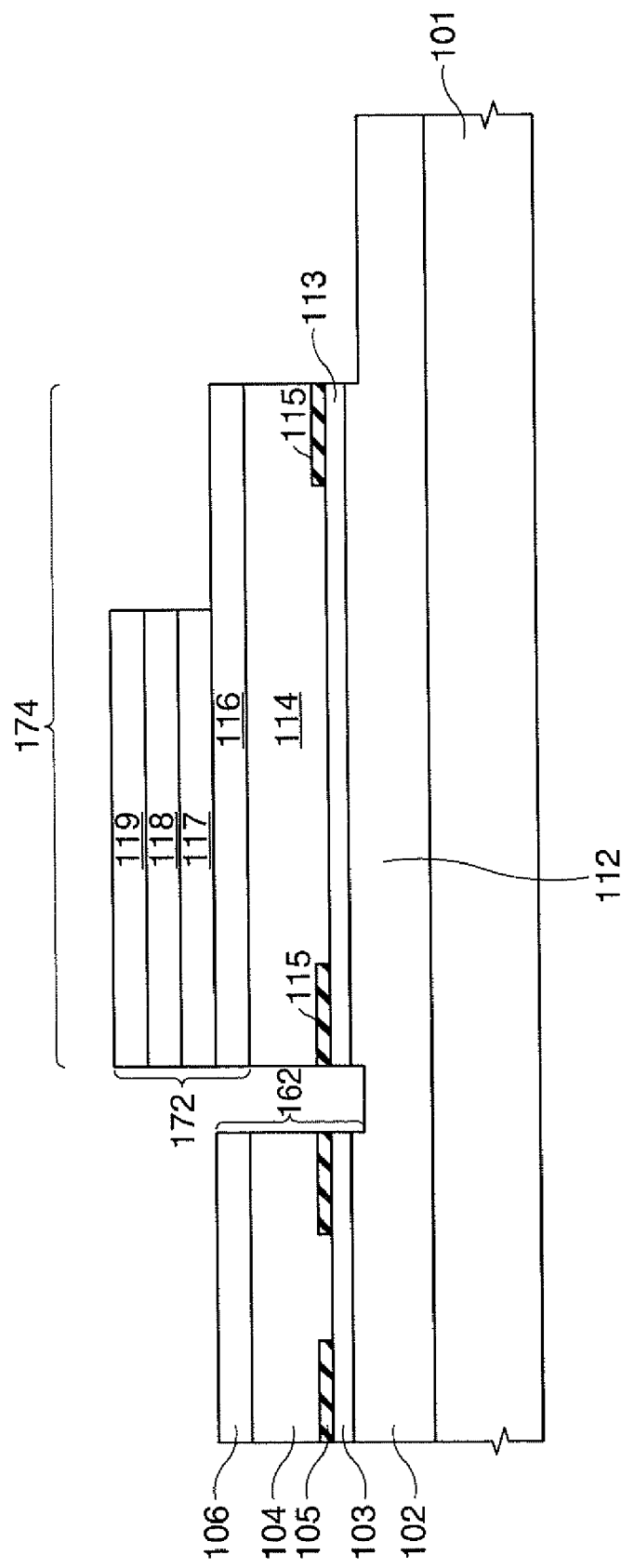
FIG. 10 is a view showing a step of the method for manufacturing an optical device in accordance with the embodiment of the invention.

It is noted that, when growing the third semiconductor layer 104a, at least one of the layers near the second semiconductor layer 103a is formed to be a layer that is later oxidized and becomes a dielectric layer (see FIG. 10).

Figure 6:
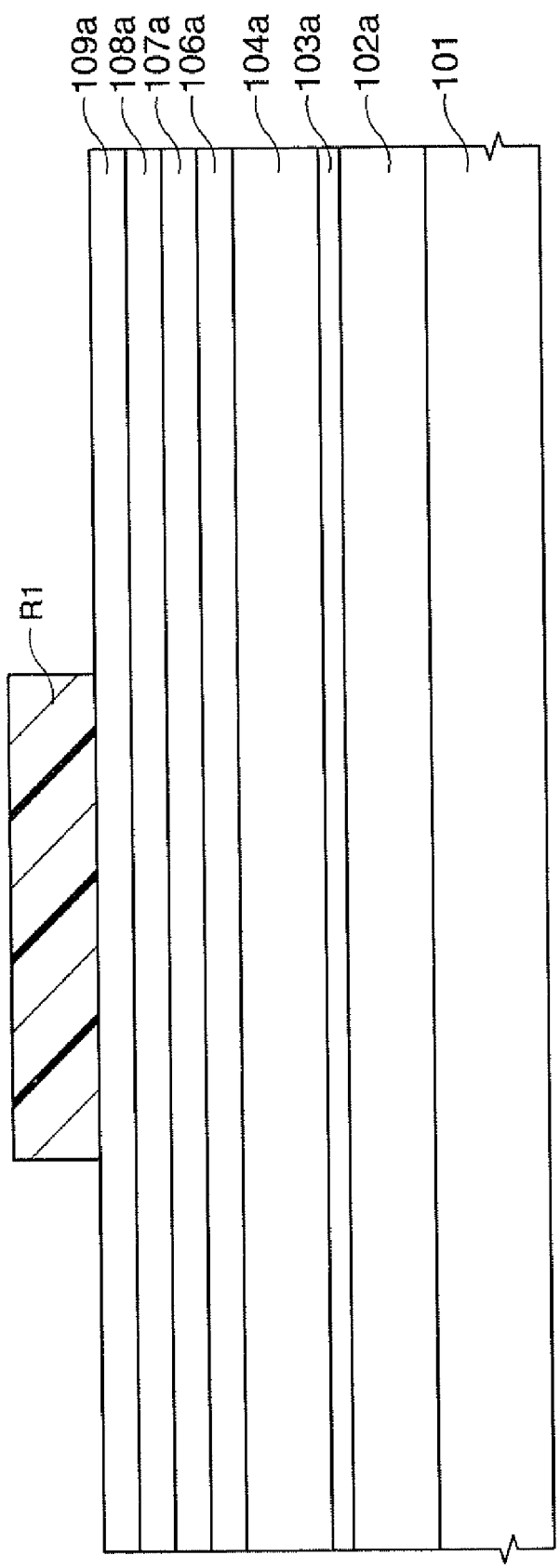
FIG. 6 is a view showing a step of the method for manufacturing an optical device in accordance with the embodiment of the invention.
Figure 7:
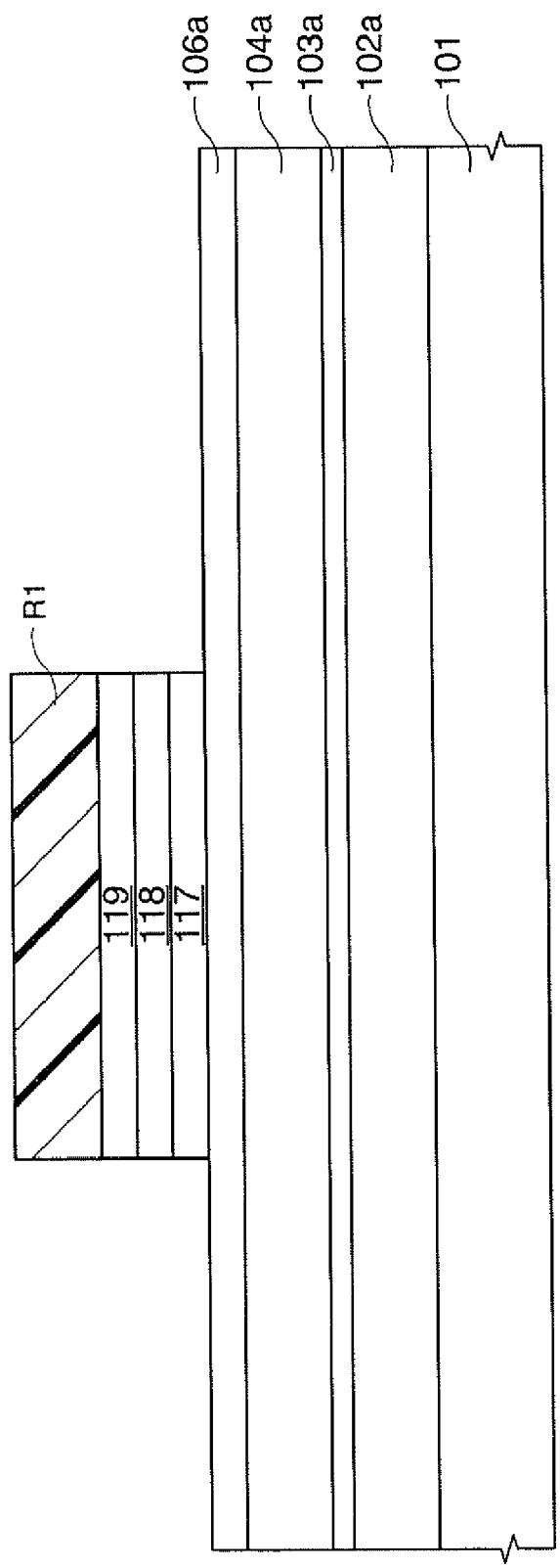
FIG. 7 is a view showing a step of the method for manufacturing an optical device in accordance with the embodiment of the invention.

(2) Next, the fourth semiconductor layer 107a, the fifth semiconductor layer 108a and the sixth semiconductor layer 109a are patterned in a specified configuration, thereby forming a fifth semiconductor section 117, a capacitance reducing section 118, and a sixth semiconductor section 119 (see FIG. 6 and FIG. 7).

First, resist (not shown) is coated on the semiconductor multilayer film, and then the resist is patterned by a lithography method, thereby forming a resist layer R1 having a specified pattern, as shown in FIG. 6.

Then, by using the resist layer R1 as a mask, the fifth semiconductor layer 108a and the sixth semiconductor layer 109a are etched until the fourth semiconductor layer 107a is exposed. It is noted that a portion of the fourth semiconductor layer 107a may be etched at the same time, but may preferably be etched to the extent that the top surface of the third semiconductor layer 106a is not exposed.

Then, by using the resist layer R1 as a mask, the fourth semiconductor layer 107a is etched by, for example, wet etching. As described above, because a p-type GaAs layer is used as the third semiconductor layer 106a, and a p-type InGaP layer is used as the fourth semiconductor layer 107a, the fourth semiconductor layer 107a can be selectively etched. By this, it becomes easier to stop etching at the time when the top surface of the third semiconductor layer 106a is exposed. A mixed solution of hydrochloric acid and water may be used as an etchant. By this, the etching selection ratio of the fourth semiconductor layer 107a can be made very high with respect to the third semiconductor layer 106a. Then, the resist layer R1 is removed. In this manner, the fifth semiconductor section 117, the capacitance reducing section 118 and the sixth semiconductor section 119 can be formed.

By etching the fourth semiconductor layer 107a by a wet etching method while making the fourth semiconductor section 116 function as an etching stopper, the top surface of the fourth semiconductor section 116 can be smoothed out. By this, a fourth electrode 131a and a fourth electrode 131b to be described below can have a favorable contact with the fourth semiconductor section 116, and the reliability of the optical device 100 can be improved.

Also, by forming the fifth semiconductor section 117 between the capacitance reducing section 118 and the fourth semiconductor section 116 as an etching stopper, the thickness of the capacitance reducing section 118 can be decided according solely to the capacitance value of the junction diode 172.

It is noted that, although a p-type InGaP layer is used as the fourth semiconductor layer 107a in the present embodiment, an i-type InGaP layer or a p-type or i-type AlGaAs layer may be used instead.

Figure 8:
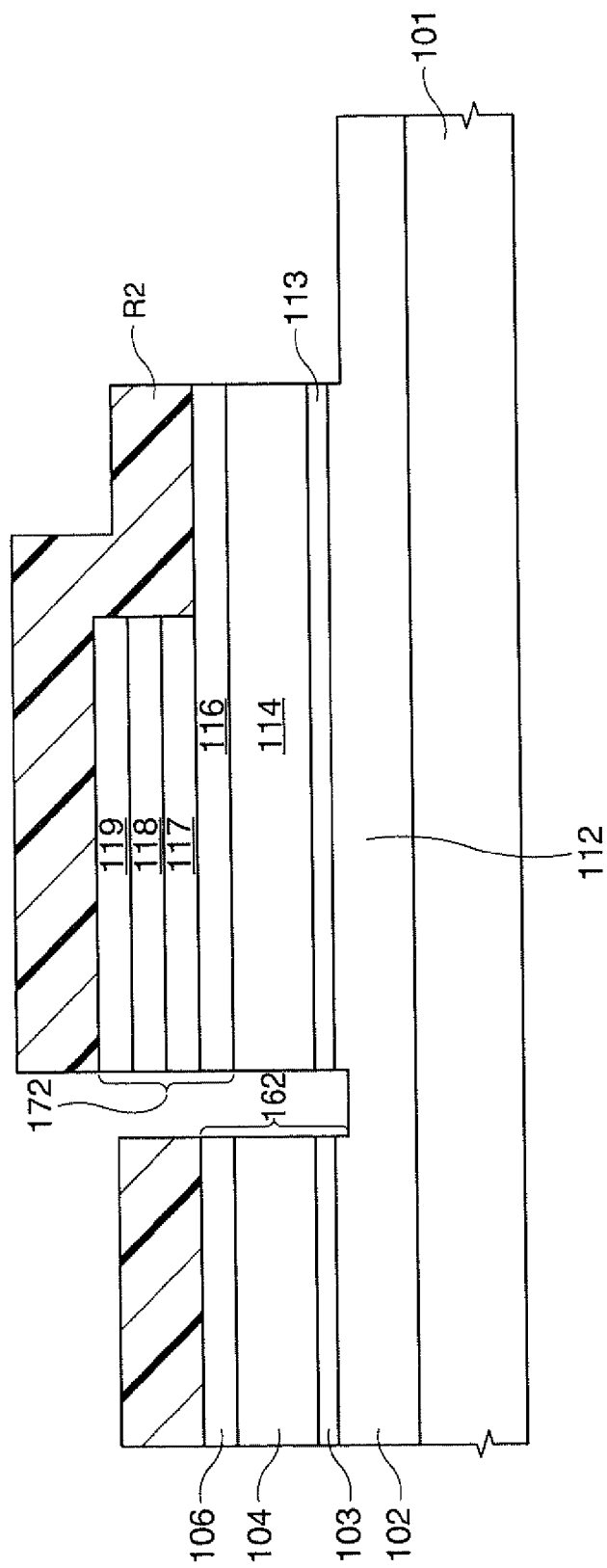
FIG. 8 is a view showing a step of the method for manufacturing an optical device in accordance with the embodiment of the invention.
Figure 9:
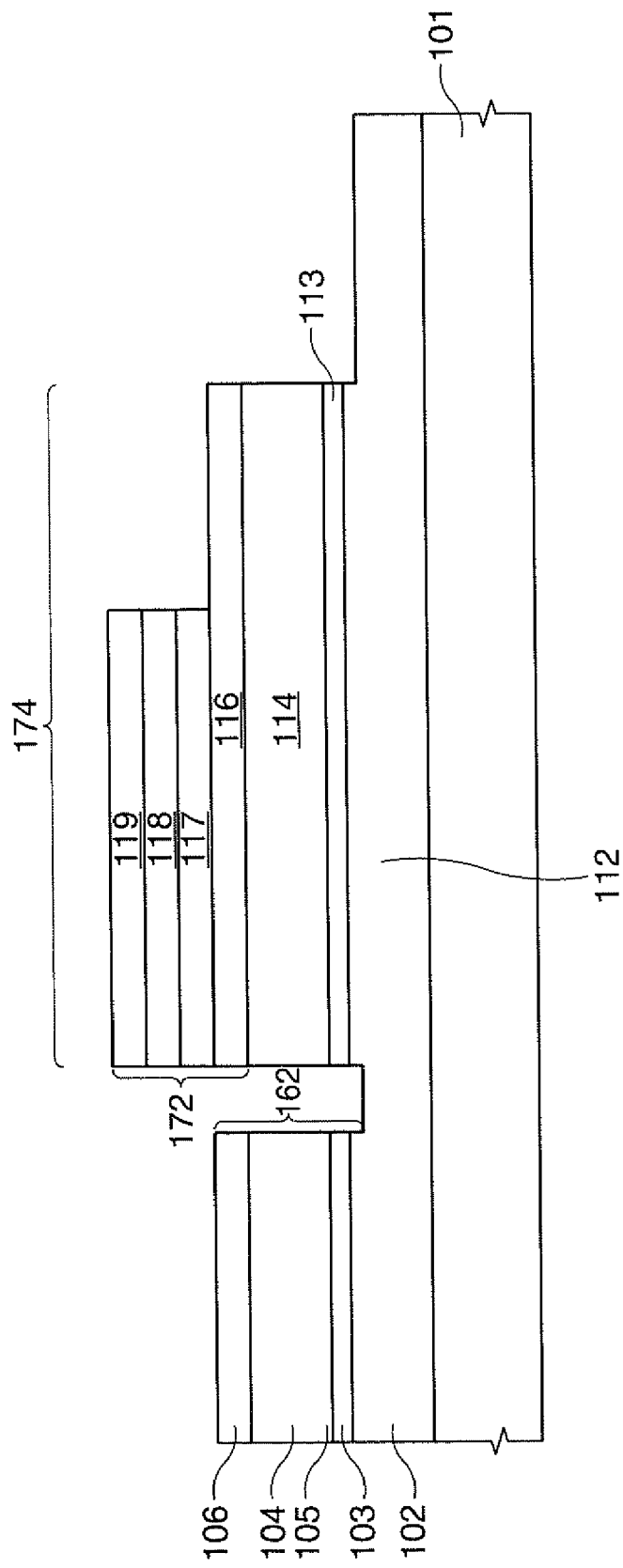
FIG. 9 is a view showing a step of the method for manufacturing an optical device in accordance with the embodiment of the invention.

(3) Next, the third semiconductor layer 106a, the third semiconductor layer 104a, the second semiconductor layer 103a, and a portion of the first semiconductor layer 102a are patterned in a specified configuration (see FIG. 8). More concretely, first, resist (not shown) is coated over the third semiconductor layer 106a, and then the resist is patterned by a lithography method, whereby a resist layer R2 is formed. Next, by using the resist layer R2 as a mask, etching is conducted by, for example, a dry etching method. Then, the resist layer R2 is removed.

By this, a junction diode 172 of the rectification device section 170 and a columnar section 162 of the surface-emitting type semiconductor laser 160 can be formed at the same time.

(4) Next, by placing the semiconductor substrate 101 on which the columnar section 162 of the surface-emitting type semiconductor laser 160 and the junction diode 172 of the rectification device section 170 are formed through the aforementioned steps in a water vapor atmosphere at about 400° C., for example, a layer having a high Al composition provided in the second mirror 104 and the fourth semiconductor section 114 is oxidized from its side surface, whereby a current constricting layer 105 of the surface-emitting type semiconductor laser 160 and a dielectric layer 115 (see FIG. 10) are formed.

(5) Next, resin layers 143 and 144 are formed (see FIG. 11) in specified regions over the semiconductor substrate 101. The resin layers 143 and 144 may be composed of an inorganic material such as silicon nitride, silicon oxide or the like, or may be composed of another resin, such as, for example, polyimide resin, fluororesin, acrylic resin, or epoxy resin. Also, the resin layer may be provided in a plurality of layers or a single layer.

Figure 11:
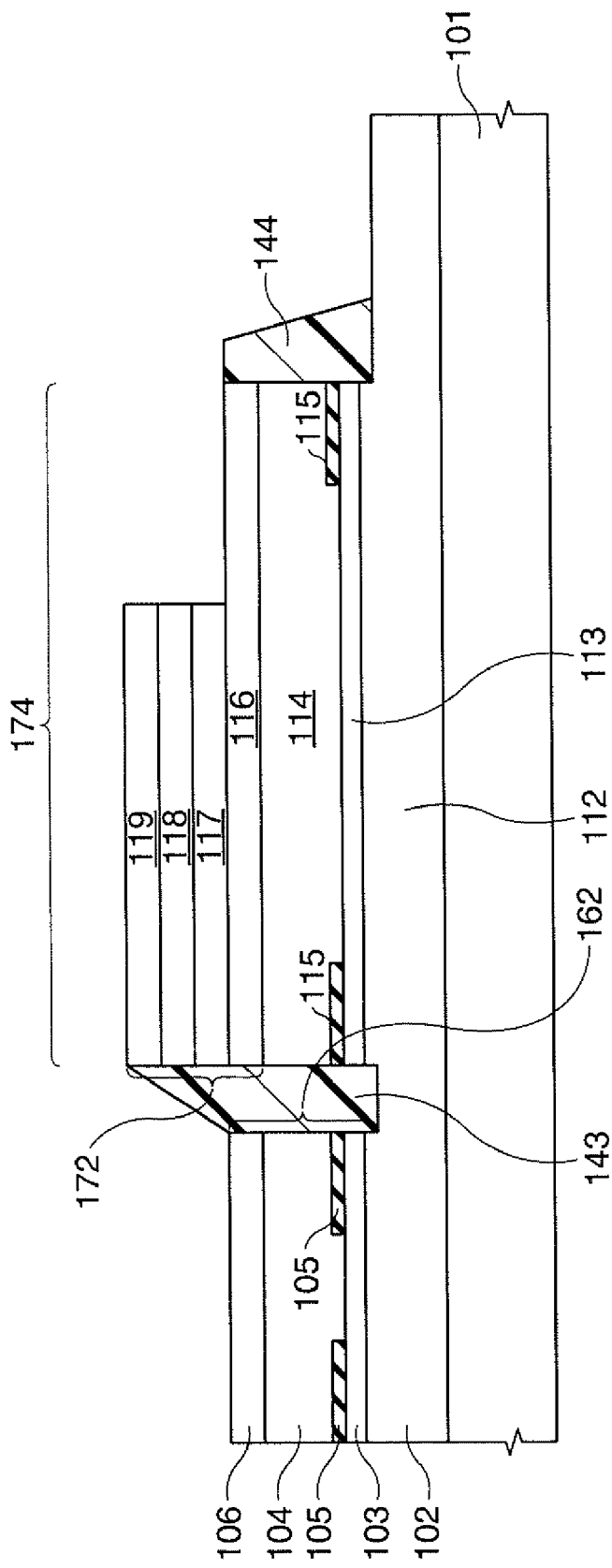
FIG. 11 is a view showing a step of the method for manufacturing an optical device in accordance with the embodiment of the invention.
Figure 12:
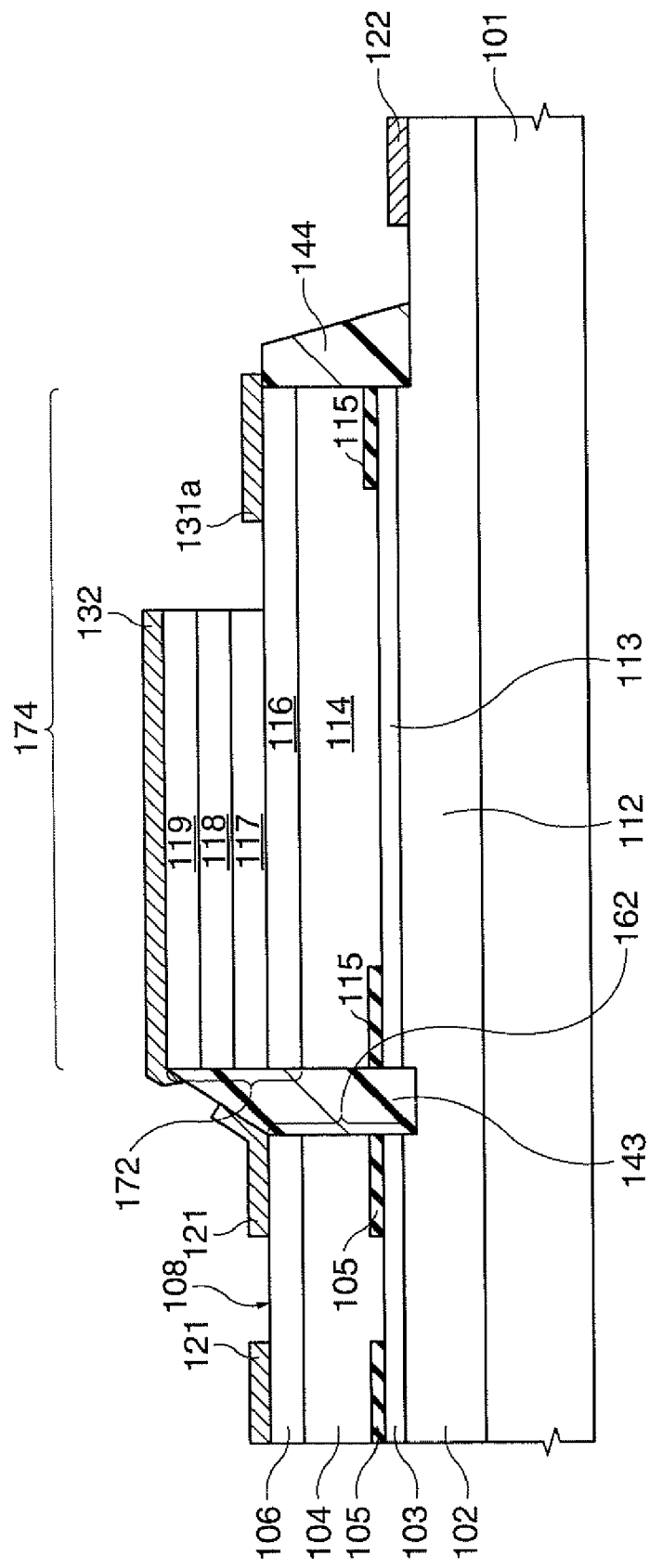
FIG. 12 is a view showing a step of the method for manufacturing an optical device in accordance with the embodiment of the invention.
Figure 13:
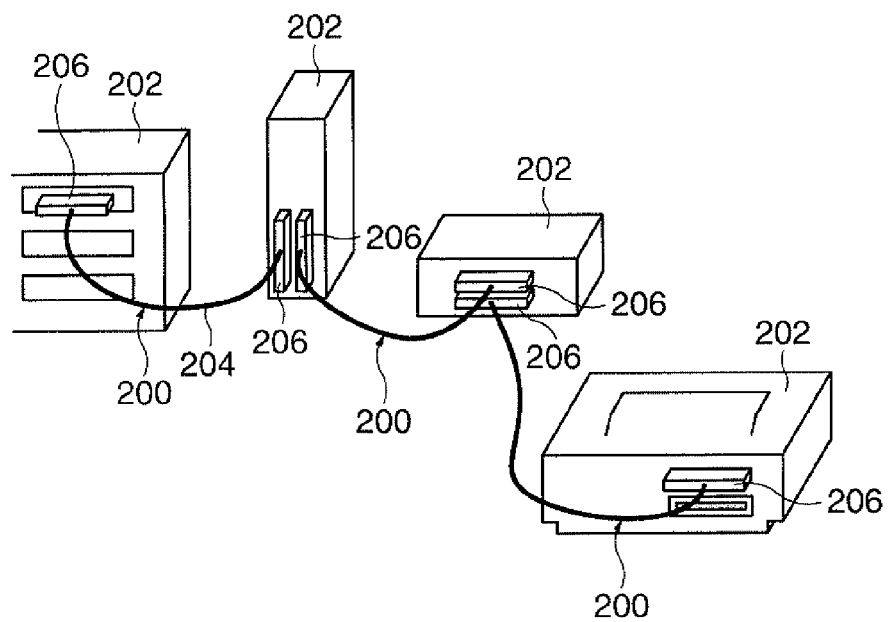
FIG. 13 is a view showing an example of an optical transmission device using an optical device in accordance with an embodiment of the invention.

(6) Next, a fourth electrode 131a, a fourth electrode 131b, a third electrode 132, a first electrode 121, and a second electrode 122 are formed (see FIG. 11).

First, before forming the electrodes, electrode forming areas may be washed with a plasma treatment or the like if necessary.

The fourth electrode 131a and the fourth electrode 131b are formed with the same material. The first electrode 121, the fourth electrode 131a and the fourth electrode 131b are formed from a p-type electrode material, and may be formed from, for example, a laminate of platinum (Pt) and gold (Au) layers. The second electrode 122 and the third electrode 132 are composed of an n-type electrode material, and may be formed from, for example, a laminated film of layers of an alloy of gold and germanium (AuGe), nickel (Ni) and gold (Au). Also, as a method for forming the electrodes, for example, at least a conductive layer in a single layer may be formed by a sputter method or a vacuum deposition method, and then a part of the conductive layer may be removed by a lift-off method. It is noted that a dry etching method may be used instead of the lift-off method. An opening section of the first electrode 121 defines an emission surface 108 of the surface-emitting type semiconductor laser 160. Further, alignment marks 220 (see FIG. 1) may be formed concurrently with the formation of the electrodes.

(7) Next, a first connection electrode 141 and a second connection electrode 142 are formed (see FIG. 1 and FIG. 2).

The first connection electrode 141 and the second connection electrode 142 may be formed with, for example, gold (Au). As a method for forming the electrode, a forming method similar to the forming method described above may be used.

In this manner, the optical device 100 including the rectification device section 170 and the surface-emitting type semiconductor laser 160 can be formed. By this, even when a reverse bias voltage is impressed to the surface-emitting type semiconductor laser 160, the current flows to the rectification device section 170, such that the electrostatic breakdown tolerance against a reverse bias voltage is substantially improved. Accordingly, electrostatic breakdown of the optical device in the mounting process and the like can be prevented, and the reliability thereof can be improved.

3. Optical Transmission Device

FIG. 15 is a diagram showing optical transmission devices having optical devices 100 in accordance with an embodiment of the present invention. The optical transmission devices 200 mutually connect electronic devices 202 such as a computer, a display device, a storage device, a printer and the like. The electronic devices 202 may be information communication devices. The optical transmission device 200 may have a cable 204 and plugs 206 provided on both ends thereof. The cable 204 includes an optical fiber. The plug 206 has a built-in optical device 100. The plug 206 may further have a built-in semiconductor chip.

The optical device 100 connected to one of the end sections of the optical fiber is a light emitting device, and an optical device connected to the other end of the optical fiber is a light-receiving device. Electrical signals outputted from the electronic device 202 on one end are converted to optical signals by the optical device. The optical signals are transmitted through the optical fiber and inputted in the light-receiving device. The light-receiving device converts the inputted optical signals to electrical signals. Then, the electrical signals are inputted in the electronic device 202 on the other end. In this manner, by the optical transmission device 200 of the present embodiment, information can be transmitted among the electronic devices 202 by optical signals.

Figure 14:
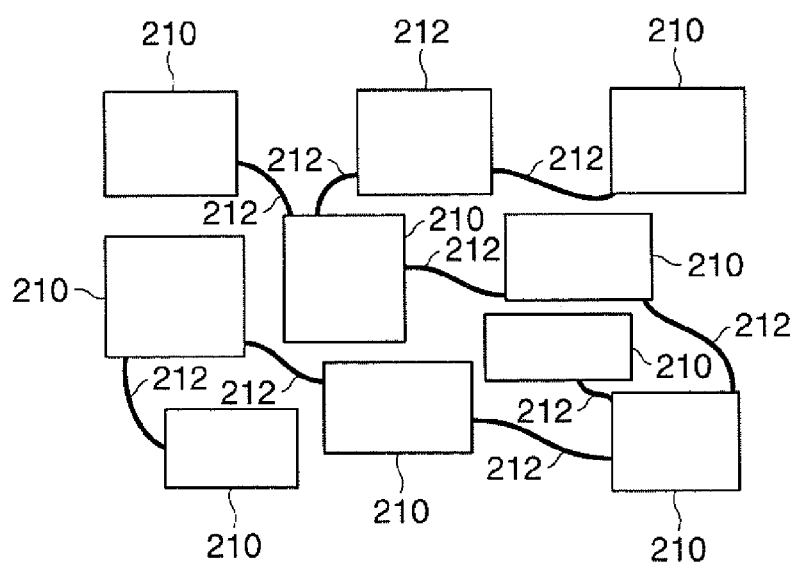
FIG. 14 is a view showing a usage configuration of the optical transmission devices using optical devices in accordance with an embodiment of the invention.

FIG. 14 is a diagram showing a usage configuration of optical transmission devices using the optical devices 100 in accordance with the present embodiment. The optical transmission devices 212 connect electronic devices 210. The electronic devices 210 may be, for example, liquid crystal display monitors, digital CRTs (which may be used in the fields of finance, mail order, medical treatment, and education), liquid crystal projectors, plasma display panels (PDP), digital TVs, cash registers of retail stores (for POS (Point of Sale Scanning)), videos, tuners, gaming devices, printers and the like.

The invention is not limited to the embodiments described above, and many modifications can be made. For example, the invention may include compositions that are substantially the same as the compositions described in the embodiments (for example, a composition with the same function, method and result, or a composition with the same object and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. An optical device comprising:
    a light emitting device section including, above a substrate, a first semiconductor section of a first conductivity type that functions as a first mirror, a second semiconductor section that functions as an active layer, and a third semiconductor section of a second conductivity type that functions as a second mirror, arranged in this order from a side of the substrate;
    a rectification device section including, above the substrate, a first support section composed of the same composition as that of the first semiconductor section, a second support section composed of the same composition as that of the second semiconductor section, a fourth semiconductor section of the second conductivity type, a fifth semiconductor section composed of a material having a greater etching rate than the fourth semiconductor section, a capacitance reducing section, and a sixth semiconductor section of the first conductivity type, which are arranged in this order from a side of the substrate; and
    first and second electrodes for driving the light emitting device section,
    wherein the fourth and sixth semiconductor sections are connected between the first and second electrodes in parallel with the light emitting device section to have a rectification action in a reverse direction with respect to the light emitting device section;
    a film thickness of the capacitance reducing section is greater than a film thickness of the fifth semiconductor section;
    the fifth semiconductor section has a greater difference in lattice constant with respect to the fourth semiconductor section than that of the capacitance reducing section; and
    the fifth semiconductor section is a single atom layer.

2. An optical device according to claim 1, wherein the fourth semiconductor section is composed of the same composition as that of the third semiconductor section.

3. An optical device according to claim 1, wherein the capacitance reducing section is composed of intrinsic semiconductor.

4. An optical device according to claim 1, wherein the capacitance reducing section is composed of semiconductor including an impurity with a lower concentration than that of the fourth or sixth semiconductor section.

5. An optical device according to claim 1, wherein the fifth semiconductor section has the second conductivity type.

6. An optical device according to claim 1, wherein the fourth semiconductor section is formed to include a GaAs layer at a topmost surface thereof, and the fifth semiconductor section is formed from an InGaP layer.

7. An optical device according to claim 1, wherein the fourth semiconductor section is formed to include a GaAs layer at a topmost surface thereof, and the fifth semiconductor section is formed from a AlGaAs layer.

8. An optical device according to claim 1, wherein
    the light emitting device section functions as a surface-emitting type semiconductor laser,
    the first semiconductor section functions as a first mirror,
    the third semiconductor section functions as a second mirror,
    the topmost surface of the third semiconductor section and the fourth semiconductor section are formed from GaAs layers,
    the fifth semiconductor section is formed from a InGaP layer,
    the capacitance reducing section and the sixth semiconductor section are formed from GaAs layers, and
    the first electrode is formed on the top surface of the third semiconductor section, and
    the optical device further comprising a third electrode that is electrically connected to the first electrode and formed on the top surface of the sixth semiconductor section, and a fourth electrode that is electrically connected to the second electrode and formed on the top surface of the fourth semiconductor section.

9. An optical device according to claim 1, wherein a film thickness of the capacitance reducing section is at least 50 nm or greater.

10. An optical device according to claim 1, wherein a film thickness of the capacitance reducing section is 2 μm or less.

11. An optical device according to claim 1, further comprising a pair of insulating layers, each insulating layer having a sidewall inclined at an angle that is directed toward an edge of the substrate.

* * * * *

UNITED STATES PATENT AND TRADEMARK OFFICE
CERTIFICATE OF CORRECTION

| | | |
|---|---|---|
| PATENT NO. | : 7,838,890 B2 | Page 1 of 1 |
| APPLICATION NO. | : 11/696219 | |
| DATED | : November 23, 2010 | |
| INVENTOR(S) | : Tetsuo Nishida and Hajime Onishi | |

It is certified that error appears in the above-identified patent and that said Letters Patent is hereby corrected as shown below:

Title Page: Item (75) Inventors: should read:

-- Tetsuo Nishida, Suwa (JP);
Hajime Onishi, Chino (JP) --

Signed and Sealed this
Third Day of May, 2011

David J. Kappos
*Director of the United States Patent and Trademark Office*